(12) United States Patent
Nakamoto et al.

(10) Patent No.: US 6,185,713 B1
(45) Date of Patent: Feb. 6, 2001

(54) METHOD AND APPARATUS FOR IMPROVING STUCK-AT FAULT DETECTION IN LARGE SCALE INTEGRATED CIRCUIT TESTING

(75) Inventors: Alan Nakamoto, Richmond; Kris Iniewski, Coquitlam; Monika Swic, Vancouver; Curtis Lapadat; Larrie Simon Carr, both of Burnaby, all of (CA)

(73) Assignee: PMC-Sierra Ltd., Burnaby (CA)

( * ) Notice: Under 35 U.S.C. 154(b), the term of this patent shall be extended for 0 days.

(21) Appl. No.: 09/057,507

(22) Filed: Apr. 9, 1998

(51) Int. Cl.[7] .................................................. G01R 31/28
(52) U.S. Cl. ............................................................ 714/734
(58) Field of Search ............................... 714/734, 31, 25; 710/126–129; 324/73.1

(56) References Cited

U.S. PATENT DOCUMENTS

| | | | |
|---|---|---|---|
| 5,036,473 | * | 7/1991 | Butts et al. ....................... 395/500.44 |
| 5,450,025 | * | 9/1995 | Shay ......................................... 326/81 |
| 5,467,031 | * | 11/1995 | Nguyen et al. ......................... 326/81 |
| 5,546,019 | * | 8/1996 | Liao ........................................ 326/81 |
| 5,712,857 | * | 1/1998 | Whitman et al. ..................... 714/724 |
| 5,966,036 | * | 10/1999 | Hoff et al. ............................. 327/112 |
| 5,969,541 | * | 10/1999 | Waggoner ............................... 326/81 |

OTHER PUBLICATIONS

Introduction to Switching Theory and Logical Design, 3d Edition, Hill, et al., 1981, pp. 258–261.*

* cited by examiner

*Primary Examiner*—Albert DeCady
*Assistant Examiner*—Guy Lamarre
(74) *Attorney, Agent, or Firm*—Oyen Wiggs Green & Mutala

(57) ABSTRACT

A bus holder for coupling to an integrated circuit bus driven by a plurality of tri-state devices. The bus holder has a bidirectional port and first and second test ports. Logic circuitry coupled between the respective ports is configured such that application of a logic 0 to the first test port causes the bidirectional port to drive whatever logic value is applied to that port; application of a logic 1 to the first test port and application of a logic 0 to the second test port pulls the bidirectional port down to a logic 0; and, application of a logic 1 to both the first and second test ports pulls the bidirectional port up to a logic 1.

4 Claims, 4 Drawing Sheets

| Z | T | V | Z' |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 1 |
| 1 | 0 | 1 | 1 |
| 1 | 1 | 0 | 0 |
| 1 | 1 | 1 | 1 |

| | INP1 | ENB1 | INP2 | ENB2 | I | CHARGE I=0 | | CHARGE I=1 | |
|---|---|---|---|---|---|---|---|---|---|
| | | | | | | V=0 | V=1 | V=0 | V=1 |
| GOOD MACHINE | 0 | 0 | 0 | 0 | Z FLOAT | I=0 (NO DETECT) | I=0 (HARD DETECT) | I=0 (NO DETECT) | I=0 (HARD DETECT) |
| FAULTY | | | | | | | | | |
| PULSE ENABLE | 0 | 0 | 0 | STUCK-AT-1 | 0 | I=0 HARD DETECT | I=0 (NO DETECT) | I=0 HARD DETECT | I=1 (NO DETECT) |
| PULSE ENABLE | 0 | 0 | STUCK-AT-1 | 0 | Z FLOAT | I=0 (HARD DETECT) | I=0 (HARD DETECT) | I=0 (NO DETECT) | I=1 (HARD DETECT) |
| PULSE ENABLE | 0 | STUCK-AT-1 | 0 | 0 | 0 | I=0 (HARD DETECT) | I=0 (NO DETECT) | I=0 HARD DETECT | I=1 (NO DETECT) |
| PULSE ENABLE | STUCK-AT-1 | 0 | 0 | 0 | Z FLOAT | I=0 (NO DETECT) | I=0 (NO DETECT) | I=0 HARD DETECT | I=1 (HARD DETECT) |
| PULSE ENABLE | 0 | 0 | 0 | STUCK-AT-0 | Z FLOAT | I=0 (NO DETECT) | I=1 HARD DETECT | I=0 HARD DETECT | I=1 (HARD DETECT) |
| PULSE ENABLE | 0 | 0 | STUCK-AT-0 | 0 | Z FLOAT | I=0 (NO DETECT) | I=1 HARD DETECT | I=0 HARD DETECT | I=1 (NO DETECT) |
| USE GOOD MACHINE=1 | 0 | 0 | 0 | 0 | Z FLOAT | I=0 (NO DETECT) | I=1 HARD DETECT | I=0 (NO DETECT) | I=1 (NO DETECT) |
| PULSE ENABLE | 0 | STUCK-AT-0 | 0 | 0 | Z FLOAT | I=0 NO DETECT | I=1 HARD DETECT | I=0 (NO DETECT) | I=1 (NO DETECT) |
| USE GOOD MACHINE=1 | STUCK-AT-0 | 0 | 0 | 0 | Z FLOAT | I=0 NO DETECT | I=1 HARD DETECT | I=0 (NO DETECT) | I=1 (NO DETECT) |

FIG. 4

METHOD AND APPARATUS FOR IMPROVING STUCK-AT FAULT DETECTION IN LARGE SCALE INTEGRATED CIRCUIT TESTING

TECHNICAL FIELD

This application pertains to a bus holder cell for increasing the detection of "stuck-at" faults in automated fault testing of large scale integrated circuits.

BACKGROUND

Processes for automated fault testing of large scale integrated circuits commonly employ a "stuck-at fault" model to emulate possible physical defects that may occur during fabrication of the integrated circuit under test. Such models represent stuck-at defects as nodes or pins within the circuit that are continually held (i.e. "stuck") at a single logic level, being either a one or zero. The objective is to increase single stuck-at fault coverage in large scale digital integrated circuits containing tri-statable multiplexers or other internal tri-state bus structures. Most commercially available fault grading tools adhere to Mil-Std-883D, Method 5012.1 to determine stuck-at fault coverage. In this process, each pin of each gate-level component within the integrated circuit under test is individually subjected to a single stuck-at fault condition. A complete set of test vectors is applied to the integrated circuit under test and the simulation results so obtained are compared with the simulation results of an identical "good" circuit (i.e. with no injected faults). If, for any one of the test vectors, the output of the faulted circuit exhibits a "hard" difference (i.e. "1" expected but "0" detected, or vice versa) from the output of the good circuit, then the stuck-at fault condition is detected.

Problems arise in the detection of stuck-at fault conditions in tri-state circuits. For example, FIG. 1 shows three tri-state devices 10, 12, 14 sharing a common bus 16. Suppose that a stuck-at fault condition exists at the ENB1 enable pin of device 10. This results in transfer, by device 10, of the value at the INP1 input pin to bus 16. Now suppose that device 12 is enabled so as to transfer the value at the INP2 input pin of device 12 to bus 16. If the INP2 value is the same as the INP1 value, then that value is passed to the output without detection of the stuck-at fault condition at the ENB1 pin of device 10. If the INP2 value is opposite to the INP1 value, then an "X" (unknown) value is passed to the output and a "possibly detected fault" condition is noted. Because the specific condition responsible for the fault is unclear, Mil-Std-883D, Method 5012.1 does not permit the aforementioned fault to be included in the final count of detected faults. Consequently, lower test coverage is achieved.

Designers attempt to circumvent the foregoing problem by accepting reduced test coverages; or, by using non-tristatable gates. However, the latter approach tends to increase circuit size and often adversely affects speed. Another approach is to use a storage element such as bus repeater 18 to maintain a saturated logic value on the bus when all active drivers have been tristated.

Bus repeater 18 is used to identify the fault by initially charging the bus with a logic "0" or "1". Then, all of the inputs to the tri-state devices connected to the bus are driven to the opposite value, without enabling any of those devices. The logic level on the bus is then sensed, again without enabling any of the tri-state devices. In a "good" circuit, the logic level is the same as before, namely that with which bus repeater 18 initially charged the bus. In a "bad" circuit, (i.e. a circuit in which the output enable pins of any one or more of the tri-state devices is stuck in the enabled condition) the logic level is opposite to the value with which bus repeater 18 initially charged the bus.

However, bus repeaters present additional problems. A bus repeater, being a form of non-gated flip flop, is easily strong enough to overdrive the output and change the state of the bus. In the steady state, the bus repeater maintains the state weakly, even when the original driver tristates. This is adequate for maintaining a low current state (e.g. for IDDQ testing) but presents problems in the presence of noise.

Assume that a net in the bus of interest has been driven to a high state and then the driver tristates. In this context, a "net" is equivalent to a wire segment which makes an electrical connection between a cell's input and output pins. A stuck-at fault on either the input pin or the output pin of that cell is equivalent to a single "net fault" for the cell as a whole. In other words, the minimum drive bus repeater is maintaining a logic "1" on the net, when an adjacent net (or the substrate) having significant capacitance to the tristated net switches, causing a noise glitch on the net. The bus repeater resists the noise transient to some degree. But, if the noise transient is strong enough, the bus repeater may switch to the opposite state. The bus repeater is now maintaining the incorrect state on the bus—but it is a legitimate saturated logic state (e.g. acceptable for IDDQ testing). The problem is that the "exposure time" to such noise transients is 100% of the time, because the bus repeater operates continuously; it does not "hard latch" a state based on a clock pulse window. Thus, although bus repeaters may be useful for ensuring low current states on tristated buses for IDDQ testing, they can not be relied upon for maintaining logic values in the presence of noise or crosstalk. The present invention addresses these problems.

SUMMARY OF INVENTION

In accordance with the preferred embodiment, the invention provides a bus holder for coupling to an integrated circuit bus driven by a plurality of tri-state devices. The bus holder has a bidirectional port and first and second test ports. Logic circuitry coupled between the respective ports is configured such that application of a logic 0 to the first test port causes the bidirectional port to drive any logic value applied to that port; application of a logic 1 to the first test port and application of a logic 0 to the second test port pulls the bidirectional port down to a logic 0; and, application of a logic 1 to both the first and second test ports pulls the bidirectional port up to a logic 1. The bus holder's bus driving capability is less than that of any of the tri-state devices.

In one embodiment, the logic circuitry includes a first nand gate having a first inverted input coupled to the bidirectional port. A first input of a second nand gate is coupled to the first nand gate's output. The second nand gate's output is coupled to the bidirectional port. A first inverter is coupled between the first test port and a second input of the first nand gate. A second inverter is coupled between the second test port and a first input of a third nand gate. A second input of the third nand gate is coupled to the first test port and the third nand gate's output is coupled to a second input of the second nand gate.

In an alternate embodiment, the logic circuitry includes a multiplexer having a first input port coupled to a bidirectional port, a second input port coupled to the second test port, a selection input port coupled to the first test port, and an output port coupled to the bidirectional port. An inverter is coupled between the second test port and the multiplexer's second input port.

The invention also provides a method of improving detection of stuck-at faults in fault testing of an integrated circuit having a bus driven by a plurality of tri-state devices. In accordance with the method, the bus, which is coupled to a bidirectional port, is pulled down to a logic 0 value at the bidirectional port by applying to the bidirectional port, a pull down signal having a bus driving capability less than any of the tri-state devices' bus driving capabilities. A determination that at least one of the tri-state devices has a stuck-at fault is made if the logic value appearing at the bidirectional port during the pull down step is not 0. The bus is then pulled up to a logic 1 value at the bidirectional port by applying to the bidirectional port, a pull up signal having a bus driving capability less than any of the tri-state devices' bus driving capabilities. A determination that at least one of the tri-state devices has a stuck-at fault is made if the logic value appearing at the bidirectional port during the pull up step is not 1.

BRIEF DESCRIPTION OF DRAWINGS

FIG. 4 is a truth table for the tri-state integrated circuit of FIG. 1.

DESCRIPTION

The invention provides a new bus holder cell having pull up and pull down functionality. The bus holder cell replaces the prior art bus repeater and provides control capabilities to facilitate driving an otherwise undriven bus to a specific value.

Figure 2:
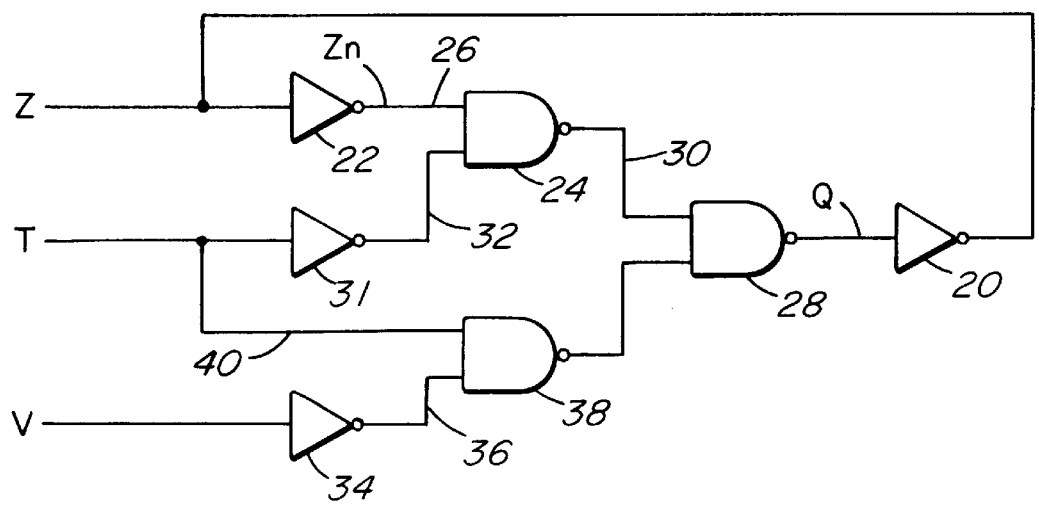
FIG. 2 is a schematic diagram of a bus holder cell in accordance with the present invention.

As shown in FIG. 2, the bus holder cell has three ports: "T" (input test port enable), "V" (input value, or second test port), and "Z" (bidirectional bus input and output port). "Q" is a reference point which is useful in explaining the functionality of the bus holder cell. Depending on the values of the T and V inputs, the bus holder cell pulls the bus to a logic high value, or pulls the bus to a logic low level, or has no effect on the bus value. For example, as shown in the FIG. 3 truth table, if T is a logic 0, then the bus holder cell has no effect on the bus value, regardless of the bus holder cell's V input value. It can thus be seen that the "bus holder" portion of the bus holder cell, shown as the Z-Zn-Q path, is enabled and maintains the bus value if T is a logic 0.

Figures 3, 6:
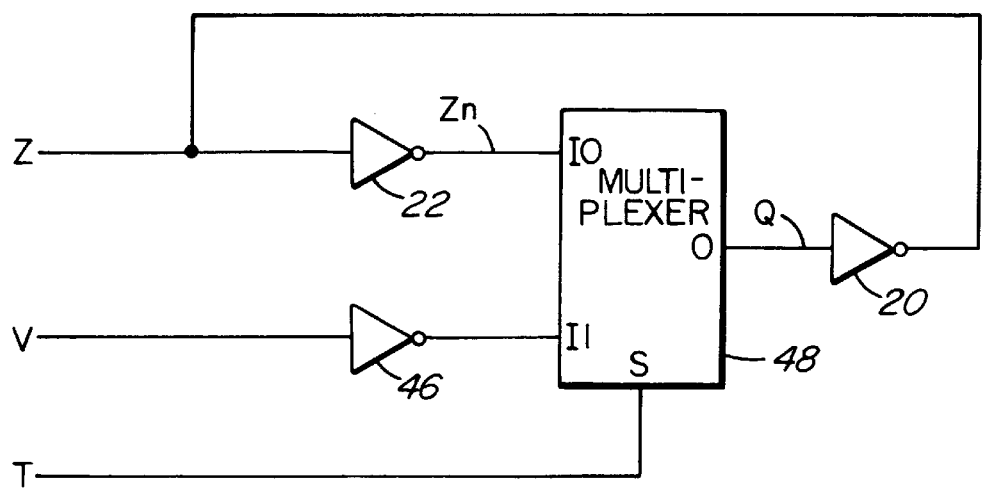
FIG. 3 is a truth table for the bus holder cell of FIG. 2.
FIG. 6 is a schematic diagram of an alternative bus holder cell embodying the invention.

Further examination of FIGS. 2 and 3 reveals that if T is a logic 1 and if V is a logic 0, the bus value Z is pulled down (i.e. Z') to logic 0; and, if T is a logic 1 and V is a logic 1, the bus value Z is pulled up (i.e. Z') to logic 1. In other words, if T is a logic 1, the bus holder portion of the bus holder cell is disabled.

The FIG. 2 bus holder cell incorporates a "logic circuit means" coupled between the Z, V, T and Q ports. Specifically, a first nand gate 24 having a first inverted input 26 is coupled to bidirectional port Z. A second nand gate 28 having a first input 30 is coupled to the output of first nand gate 24. The output of nand gate 28 is coupled to the reference point Q. A first inverter 31 is coupled between the first (T) test port and a second input 32 of first nand gate 24. A second inverter 34 is coupled between the second (V) test port and a first input 36 of a third nand gate 38. The second input 40 of nand gate 38 is coupled to the first (T) test port. The output of nand gate 38 is coupled to a second input 42 of the second nand gate 28.

As noted above, application of a logic 0 value to the first (T) test port transmits to the reference point (Q) any logic value applied to the bidirectional port (Z). Application of a logic 1 value to the first (T) test port and application of a logic 0 value to the second (V) test port pulls reference point (Q) down to a logic 0 value. Application of a logic 1 value to the first (T) test port and application of a logic 1 value to the second (V) test port pulls reference point (Q) up to a logic 1 value.

The bus holder portion of the bus holder cell must be made weaker than the weakest tristate driver coupled to the bus to ensure that the bus holder cell will not overdrive the bus and inhibit detection of stuck-at faults, as discussed above in relation to the prior art. For example, suppose that a logic 0 is input to a tristate driver coupled to the bus, but that driver's enable is stuck-at logic 0 (i.e. the driver is unable to tristate). A logic 0 appears on the bus when all of the drivers are forced to be tristated. With the FIG. 2 bus holder cell coupled to the bus, one may attempt to pull the bus value from logic 0 up to logic 1 by applying a logic 1 to both the T and V inputs of the bus holder cell. If the output of the bus does not change from logic 0 to logic 1, it may be concluded that one of the drivers is at fault. The same test methodology can be applied to verify all possible pin faults on all of the tristate enables and outputs coupled to the bus. Such verification is not possible with the prior art techniques discussed above.

Figure 1:
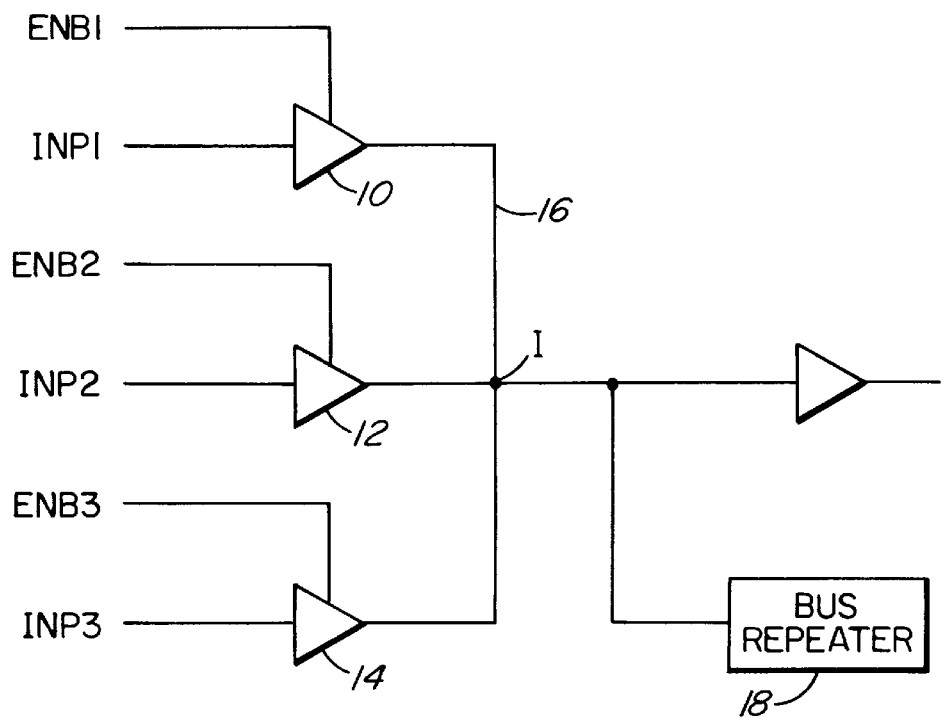
FIG. 1 is a simplified schematic diagram of a portion of a tri-state integrated circuit incorporating a prior art bus repeater.

Persons skilled in the art will appreciate that the FIG. 2 bus holder cell can be used in conjunction with various vector generation strategies to strobe tri-state buses so as to detect all possible faults. For example, a "deterministic ad-hoc" strategy may be employed. As previously explained in relation to FIG. 1, for reliable stuck-at fault detection in a situation involving two tri-state devices, one would need to have direct control over both devices' inputs and enables, as well as some observation of the outputs of the tri-state bus. Suppose however that the FIG. 2 bus holder cell is substituted for bus repeater 18 in the FIG. 1 circuit. FIG. 4 tabulates the possible situations in which different stuck-at conditions exist at each of the INP1, ENB1, INP2 and ENB2 input pins of devices 10, 12 with the output ("I") charged to a certain value. The table row labelled "good machine" shows the inputs being driven on the input pins with no injected faults. The subsequent rows show the value on the bus holder's V pin (with T asserted) required to detect the various faults. For stuck-at pin faults on the tri-state outputs, FIG. 4 clearly shows that one need only disable all of the enables on the tri-states, then attempt to pull the bus high or low with the bus holder cell. A stuck-at on any of the output ports will be flagged when the bus holder is unable to switch the bus value from the stuck-at value.

Alternatively, one may employ a "repeat-twice" strategy. In this brute force approach, one assumes that the tri-state bus is treated as a standard multiplexer and tested accordingly, using automatically generated vector patterns or ad-hoc vectors. The vector set is run once with the FIG. 2 bus holder cell enabled and the test value set low, then re-applied with the test value set high. This method trades off test vector efficiency with design flow ease. Although simple to implement, it potentially doubles the number of test vectors required.

As another alternative, one may employ a "pseudo-random pattern" strategy, in which a large number of pseudo-random vectors are applied to the bus circuitry. Although this strategy may give rise to some bus contentions, a similar number of hard detects also surface as the test and enable values are asserted to yield expected bus values, which, in themselves will detect a large number of the previously undetectable faults.

Figure 5:
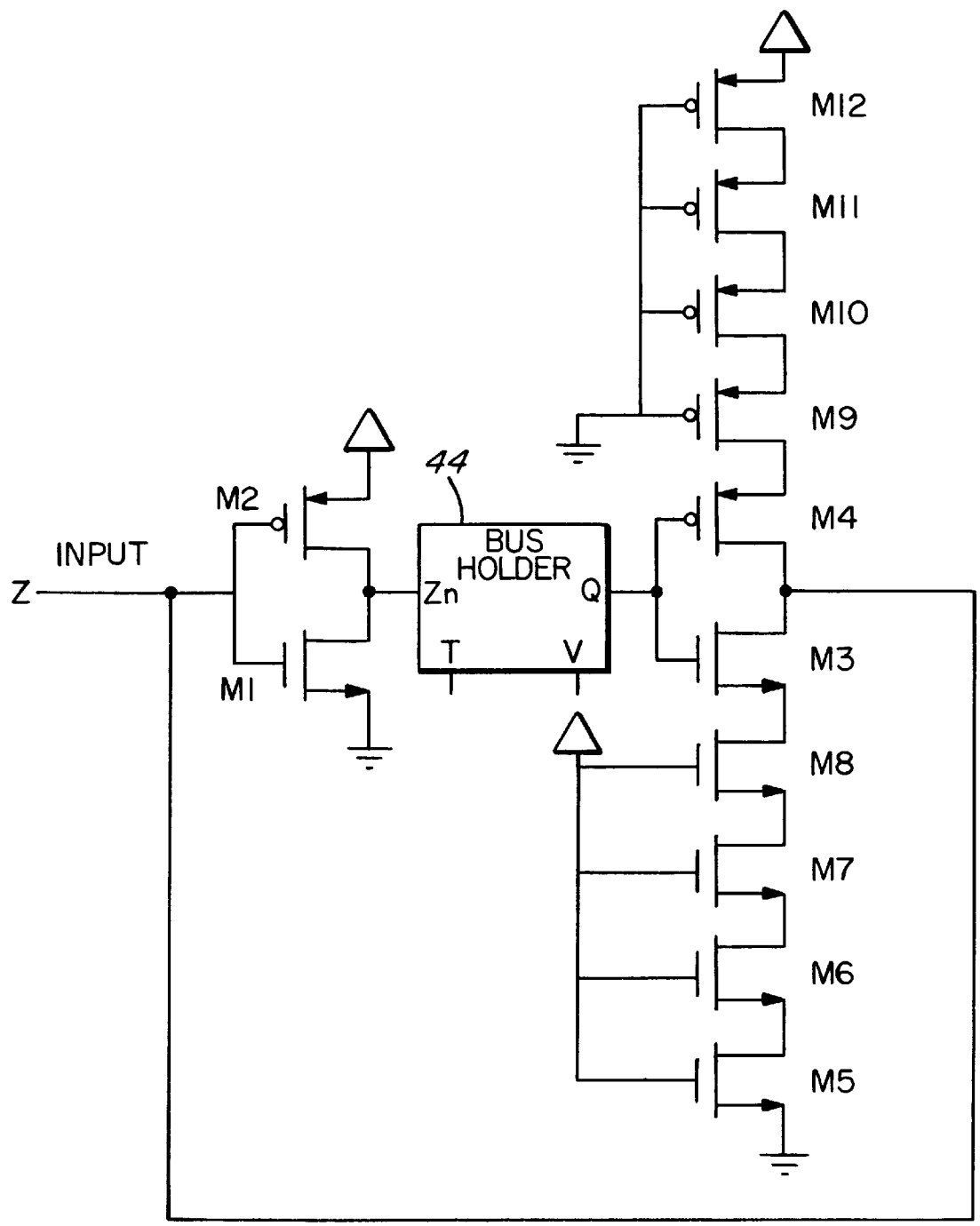
FIG. 5 is a schematic diagram of a preferred embodiment of the bus holder cell of FIG. 2.

To accommodate for noise, the bus holder cell's output driver must be able to drive an otherwise undriven bus to the values specified, yet be able to be overdriven by a standard tristate driver, leaving enough noise margin to ensure stability of the values being read. One possible circuit providing this capability is shown in FIG. 5, in which a bus holder constructed in accordance with the invention is shown schematically at 44. Transistors M1–M2 and M3–M4 form a standard CMOS inverter. Transistors M5–M8 and M9–M12 allow the cell to be over-driven by a standard tristate driver. Spice simulations of the FIG. 5 circuit for a 0.35 μm CMOS process reveal a 4.72 volt bus voltage when the driver pulls high and bus holder 44 pulls low; and, a bus voltage of 40.7 millivolts when the driver pulls low and bus holder 44 pulls high. This provides a high noise margin.

As will be apparent to those skilled in the art in the light of the foregoing disclosure, many alterations and modifications are possible in the practice of this invention without departing from the spirit or scope thereof. For example, FIG. 6 depicts an alternate bus holder cell implemented using a library of logic devices different than the library used to implement the FIG. 2 bus holder cell. Specifically, an inverter 46 and a multiplexer 48 having the following truth table:

| I0 | I1 | S | O |
|----|----|---|---|
| 0  | —  | 0 | 0 |
| 1  | —  | 0 | 1 |
| —  | 0  | 1 | 0 |
| —  | 1  | 1 | 1 | are functionally equivalent to the FIG. 2 bus holder cell. Similarly, the driving circuitry may change depending upon technology to be supported. Accordingly, the scope of the invention is to be construed in accordance with the substance defined by the following claims.

What is claimed is:

1. A bus holder for detecting stuck-at faults in fault testing of an integrated circuit having a bus driven by a plurality of tri-state devices, said bus holder comprising:
   (a) a bidirectional port;
   (b) a first test port;
   (c) a second test port;
   (d) a logic circuit coupled between said respective ports; wherein said logic circuit is configured such that:
      (i) application of a logic 0 value to said first test port causes said bidirectional port to drive any logic value applied to said bidirectional port;
      (ii) application of a logic 1 value to said first test port and application of a logic 0 value to said second test port pulls said bidirectional port down to a logic 0 value;
      (iii) application of a logic 1 value to said first test port and application of a logic 1 value to said second test port pulls said bidirectional port up to a logic 1 value; and,
      (iv) said bus holder has a bus driving capability less than any of said tri-state devices' bus driving capabilities.

2. A bus holder as defined in claim 1, wherein said logic circuit further comprises:
   (a) a first nand gate having a first inverted input coupled to said bidirectional port;
   (b) a second nand gate having a first input coupled to said first nand gate output and having an output coupled to said bidirectional port;
   (c) a first inverter coupled between said first test port and a second input of said first nand gate; and,
   (d) a second inverter coupled between said second test port and a first input of a third nand gate, said third nand gate having a second input coupled to said first test port and having an output coupled to a second input of said second nand gate.

3. A bus holder as defined in claim 1, wherein said logic circuit further comprises:
   (a) a multiplexer having:
      (i) a first input port coupled to said bidirectional port;
      (ii) a second input port coupled to said second test port;
      (iii) a selection input port coupled to said first test port;
      (iv) an output port coupled to said bidirectional port; and,
   (b) an inverter coupled between said second test port and said multiplexer second input port.

4. A method of improving detection of stuck-at faults in fault testing of an integrated circuit having a bus driven by a plurality of tri-state devices, said method comprising the steps of:
   (a) coupling said bus to a bi-directional port;
   (b) pulling said bus down to a logic 0 value at said bidirectional port by applying to said bidirectional port, a pull down signal having a bus driving capability less than any of said tri-state devices' bus driving capabilities;
   (c) determining that at least one of said tri-state devices has a stuck-at fault if the logic value appearing at said bidirectional port during said pull down step is not 0;
   (d) pulling said bus up to a logic 1 value at said bidirectional port by applying to said bidirectional port, a pull up signal having a bus driving capability less than any of said tri-state devices' bus driving capabilities; and,
   (e) determining that at least one of said tri-state devices has a stuck-at fault if the logic value appearing at said bidirectional port during said pull up step is not 1.

* * * * *